(12) United States Patent
Hsieh et al.

(10) Patent No.: US 6,599,826 B2
(45) Date of Patent: Jul. 29, 2003

(54) METHOD FOR FABRICATING A LOW DIELECTRIC CONSTANT MATERIAL LAYER

(75) Inventors: Tsung-Tang Hsieh, Taipei Hsien (TW); Cheng-Yuan Tsai, Yunlin Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/886,769

(22) Filed: Jun. 19, 2001

(65) Prior Publication Data

US 2002/0182849 A1 Dec. 5, 2002

(30) Foreign Application Priority Data

Jun. 1, 2001 (TW) .................................... 90113307 A

(51) Int. Cl.$^7$ .......................................... H01L 21/4763
(52) U.S. Cl. ........................ 438/623; 438/628; 438/778; 438/780
(58) Field of Search ................. 438/778, 240, 438/623, 628, 780, 260

(56) References Cited

U.S. PATENT DOCUMENTS 5,989,998 A * 11/1999 Sugahara et al. ........... 438/623
6,054,769 A * 4/2000 Jeng ........................... 257/758
6,100,181 A * 8/2000 You et al. ................... 438/633
6,171,663 B1 * 1/2001 Hanada et al. .............. 428/1

* cited by examiner

Primary Examiner—David Nelms
Assistant Examiner—Thao P Le
(74) Attorney, Agent, or Firm—Charles C.H. Wu; Wu & Cheung, LLP

(57) ABSTRACT

A fabrication method for a low dielectric constant (k) material layer is described. A high molecular weight material layer is formed on a substrate. The high molecular weight material layer is then cured. A bonding material layer is formed on the high molecular weight material layer, wherein a major component in the bonding material layer is an organic compound, wherein the organic compound has a silicon-containing moiety and an unsaturated hydrocarbon moiety. The bonding material layer is further cured, allowing the organic silicon compound to cross-link within the high molecular weight material layer to form a high molecular weight material layer with a silicon rich surface. Moreover, the curing for the high molecular weight material layer and for the bonding material layer can conduct concurrently.

20 Claims, 1 Drawing Sheet

METHOD FOR FABRICATING A LOW DIELECTRIC CONSTANT MATERIAL LAYER

CROSS-REFERENCE TO RELATED APPLICATION

This application claims the priority benefit of Taiwan application serial no. 90113307, filed on Jun. 1, 2001.

BACKGROUND OF THE INVENTION

1. Field of Invention

The present invention relates to a fabrication method for a semiconductor device. More particularly, the present invention relates to a fabrication method for a low dielectric constant (k) dielectric material layer.

2. Description of Related Art

The low dielectric constant (k) material is mostly used as the inter-layer dielectrics (ILD) in the manufacturing of the Ultra-Large Scale Integrated (ULSI) circuit. The application of the low k material greatly reduces the RC delay of the device and thereby increases the effectiveness of the device. Moreover, the thermal stability of the low k material also satisfies the manufacturing requirements. The mechanical strength for this type of organic high molecular weight low k material, however, is insufficient. This type of low k material is, therefore, easily damaged in the chemical mechanical polishing (CMP) process of the subsequent manufacturing of a damascene structure. As a consequence, a silicon-containing inorganic dielectric layer is usually formed on the low k material layer as a polishing stop layer. The silicon-containing inorganic dielectric layer includes silicon nitride or silicon carbide.

The bonding between the low k material layer and the silicon nitride or the silicon carbide type of inorganic material, however, is poor. The polishing stop layer is easily peeled off during chemical mechanical polishing, and the underlying organic low k material layer is therefore not being protected, leading to the problem of particulate formation. Conventionally, a hexamethyldisilazane (HMDS) layer is formed on the low k material layer, followed by forming the silicon containing inorganic dielectric layer. Since the adhesion of the silicon containing inorganic dielectric layer to the HMDS layer is better than to the organic low k material layer, using a HMDS layer improves the bonding between the organic low k material layer and the silicon containing inorganic dielectric layer. However, the adhesion of the HMDS layer to the organic low k material layer is only slightly better than that of the silicon containing inorganic dielectric layer to the organic low k material layer. The bonding between the silicon containing inorganic dielectric layer and the organic low dielectric constant material layer is not being improved significantly.

SUMMARY OF THE INVENTION

The present invention provides a fabrication method for a low k material layer, wherein a high molecular weight material layer is formed on a substrate, followed by curing the high molecular weight material layer. A bonding material layer is then formed on the high molecular weight material layer. A major component for the bonding material layer includes an organic silicon compound, wherein the organic silicon compound comprises a silicon-containing moiety and an unsaturated hydrocarbon moiety. The bonding material layer is then cured, allowing the organic silicon-containing compound to cross-link with the high molecular weight material layer. The high molecular weight material layer thereby comprises a silicon rich surface. Additionally, the curing for the above high molecular material layer and for the bonding layer can conduct concurrently.

The present invention provides a fabrication method for the inter-layer dielectrics, wherein the low k material layer manufactured according to the present invention comprises a silicon containing high molecular weight material layer. A silicon nitride or silicon carbide type of silicon containing organic material layer is further formed on the high molecular weight material layer.

According to the fabrication method for a low k material layer and inter-metal dielectrics provided by the present invention, the unsaturated hydrocarbon moiety of the organic silicon compound cross-links within the surface of the underlying high molecular weight material layer. Moreover, the silicon-containing moiety of the organic silicon compound has a high affinity to the overlying silicon-containing inorganic material layer. The bonding between the silicon-containing inorganic material layer and the high molecular weight material layer is thus increased to prevent the peeling off of the silicon-containing inorganic material layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
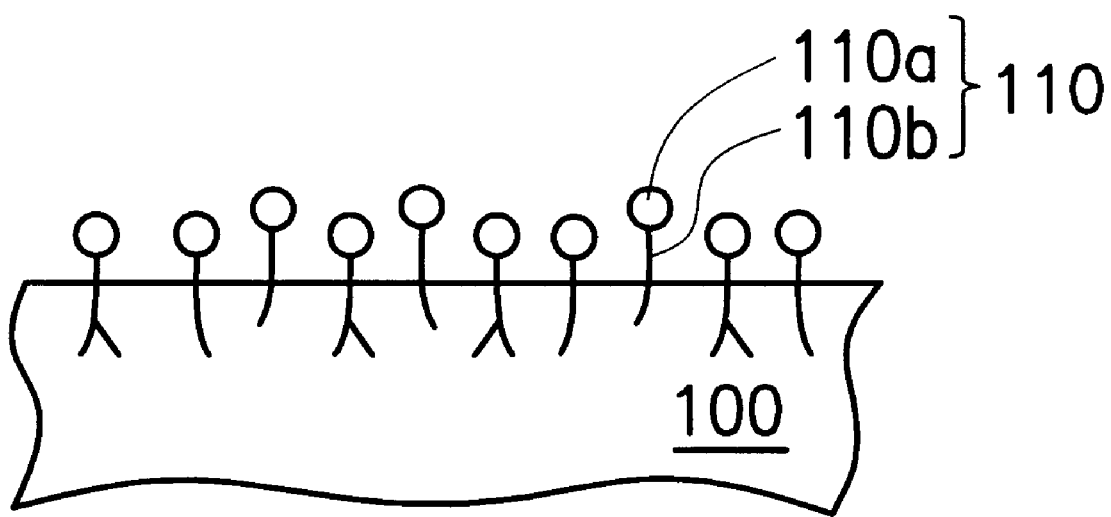
FIG. 1 is a schematic diagram, illustrating the manner of an organic silicon compound on a high molecular weight material layer according to a preferred embodiment of the method for fabricating a low dielectric constant material layer of the present invention.

The preferred embodiment of the present invention is directed toward the fabrication method of a low k material layer, wherein the low k material layer is an inter-layer dielectric (ILD) layer.

A high molecular weight material layer is formed on a substrate. The high molecular weight material layer is formed by, for example, the spin-on method. The high molecular weight material layer is then cured. The high molecular weight material layer is formed with, for example, SILK from Dow, wherein the active ingredient is an ethynyl type of aromatic compound, which at an effective concentration is polymerized to form a high molecular weight material in a curing process.

A bonding material layer is then formed on the high molecular weight material layer, wherein a major component of the bonding material layer is an organic silicon compound. As shown in FIG. 1, the organic silicon compound comprises a silicon-containing moiety 110$a$ and an unsaturated hydrocarbon moiety 110$b$. The silicon-containing moiety 110$a$ is, for example, triethoxysilanyl (—Si(OC$_2$H$_5$)$_3$) or triacetoxysilanyl (—Si(OC(=O)CH$_3$)$_3$).

The unsaturated hydrocarbon moiety 110b is, for example, an allyl (—C—C=C) or a $C_2$~$C_4$ α-ethynyl, wherein the $C_2$ α-ethynyl has a —C≡C structure and the $C_4$ α-ethynyl has a (—C—C—C≡C) structure. The formation of the bonding material layer on the high molecular weight material layer includes, for example, dissolving the organic silicon compound 110 in a solvent and applying the dissolved organic compound on the high molecular weight material layer 100 by the spin-on method. The solvent includes the types that dissolve the above higher molecular materials. The solvent penetrates into the surface of the high molecular weight material 100 layer to "swell" that part of the high molecular weight layer 100. The organic silicon compound 110, especially the unsaturated hydrocarbon moiety 110b, thus diffuses into the surface portion of the high molecular weight material layer 100.

Thereafter, the bonding material layer is cured, allowing the unsaturated moiety 110b of the organic silicon compound 110 to cross-link with the high molecular weight material 100 to form a high molecular weight material layer 100 with a silicon rich surface. The bonding material layer is cured by, for example, thermal curing or UV curing, wherein the double bond or the triple bond of the unsaturated moiety 110b is opened up to bond with the polymer chain in the high molecular weight material layer 100. The above mechanism of curing the high molecular material layer 100 is known as a sequential interpenetrating polymer networking.

Moreover, if the precursor for the high molecular weight material includes a material that contains an unsaturated moiety, such as SILK, the curing of the high molecular weight material layer can delay until the curing of the bonding material layer is conducted. The unsaturated hydrocarbon moiety of the organic silicon compound in the bonding material layer bonds with the unsaturated precursor on the surface of the high molecular weight material layer. The unsaturated precursor also polymerizes with each other to form a high molecular polymer. The organic silicon compound is thereby bond to the surface of the high molecular weight material layer to form a high molecular weight material layer with a silicon rich surface.

The following discloses the fabrication of an inter-layer dielectric layer according to a preferred embodiment of the present invention.

Subsequent to the formation of the above high molecular weight material layer with a silicon rich surface, a silicon-containing inorganic dielectric layer is formed on the high molecular weight material layer, for example, by chemical vapor deposition (CVD). The silicon-containing inorganic dielectric layer is, for example, a silicon nitride layer or a silicon carbide layer. The silicon-containing inorganic dielectric layer and the high molecular weight material layer together form the inter-layer dielectric layer. The silicon-containing inorganic dielectric layer serves to protect the underlying high molecular weight material layer during the chemical mechanical polishing process in the manufacturing of a dual damascene structure. Furthermore, the thickness of the silicon-containing inorganic dielectric layer is usually less than that of the high molecular weight material layer, to prevent having a high dielectric constant for the entire inter-layer dielectric layer.

According to the present invention, the fabrications for a low k material layer and an inter-layer dielectric layer are provided, wherein the unsaturated hydrocarbon moiety in the organic silicon compound is cross-linked with the surface of the underlying high molecular weight material layer. Moreover, the silicon-containing moiety has an excellent affinity to the overlying silicon-containing inorganic material layer to prevent the peeling-off of the silicon-containing inorganic material layer. Additionally, the curing of the high molecular material layer and the curing of the bonding material layer can be performed concurrently to reduce the number of the curing processes and the processing time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a low dielectric constant (k) material layer, comprising:

providing a substrate;

forming a high molecular weight material layer on the substrate;

curing the high molecular weight material layer;

forming a bonding material layer on the high molecular weight material layer, and a major component for the bonding material layer includes an organic silicon compound, wherein the organic silicon compound comprises a silicon containing moiety and an unsaturated hydrocarbon moiety; and curing the bonding material layer, wherein the organic silicon compound reacts with the high molecular weight material layer to form a silicon rich surface on the high molecular weight material layer.

2. The method of claim 1, wherein the bonding layer before curing is formed with the organic silicon compound and a solvent that dissolves the high molecular weight material layer.

3. The method of claim 1, wherein the high molecular material layer and the bonding material layer are cured concurrently.

4. The method of claim 1, wherein the high molecular weight material layer is formed a polymerization of an unsaturated precursor in the curing process.

5. The method of claim 1, wherein the bonding material layer is formed by thermal curing.

6. The method of claim 1, wherein the bonding material layer is formed by UV curing.

7. The method of claim 1, wherein the silicon-containing moiety includes triethoxysilanyl.

8. The method of claim 1, wherein the silicon-containing moiety includes triacetoxysilanyl.

9. The method of claim 1, wherein the unsaturated hydrocarbon moiety includes an allyl.

10. The method of claim 1, wherein the unsaturated hydrocarbon moiety includes a $C_2$ to $C_4$ α-ethynyl.

11. A fabrication method of a low k inter-layer dielectric layer, comprising:

providing a substrate;

forming a high molecular weight material layer on the substrate;

curing the high molecular weight material layer;

forming a bonding material layer on the high molecular weight material layer, and a major component for the bonding material layer includes an organic silicon compound, wherein the organic silicon compound comprises a silicon containing moiety and an unsaturated hydrocarbon moiety;

curing the bonding material layer, wherein the organic silicon compound reacts with the high molecular weight material layer to form a silicon rich surface on the high molecular weight material layer; and forming a silicon containing inorganic dielectric layer on the bonding layer.

12. The method of claim 11, wherein the bonding layer before curing is formed with the organic silicon compound and a solvent that dissolves the high molecular weight material.

13. The method of claim 11, wherein the high molecular material layer and the bonding material layer are cured concurrently.

14. The method of claim 11, wherein the high molecular weight material layer by a polymerization of an unsaturated precursor in the curing process.

15. The method of claim 11, wherein the bonding material layer is cured by thermal curing or UV curing.

16. The method of claim 11, wherein the silicon-containing moiety includes triethoxysilanyl.

17. The method of claim 11, wherein the silicon-containing moiety includes triacetoxysilanyl.

18. The method of claim 11, wherein the unsaturated hydrocarbon moiety includes an allyl.

19. The method of claim 11, wherein the unsaturated hydrocarbon moiety includes a $C_2 \sim C_4$ $\alpha$-ethynyl.

20. The method of claim 11, wherein the silicon containing inorganic dielectric layer is silicon nitride or silicon carbide.

* * * * *